(12) United States Patent
Sakaguchi

(10) Patent No.: US 6,766,266 B1
(45) Date of Patent: Jul. 20, 2004

(54) TESTING DEVICE AND TESTING METHOD FOR SEMICONDUCTOR INTEGRATED CIRCUITS

(75) Inventor: Hideaki Sakaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 266 days.

(21) Appl. No.: 09/624,014

(22) Filed: Jul. 21, 2000

(30) Foreign Application Priority Data

| Jul. 23, 1999 | (JP) | ............................................ 11-208469 |
| Jun. 9, 2000 | (JP) | ...................................... 2000-174119 |

(51) Int. Cl.⁷ .............................................. G01R 31/14
(52) U.S. Cl. ...................................... 702/117; 324/523
(58) Field of Search ........................ 702/57–59, 64–65, 702/117–118, 124, 126, 183, 189; 324/512, 522–523, 527, 537, 763–765, 770

(56) References Cited

U.S. PATENT DOCUMENTS

| 4,980,639 | A | * | 12/1990 | Yoshizawa et al. | .......... 324/751 |
| 5,331,599 | A | * | 7/1994 | Yero | .......................... 365/226 |
| 5,414,639 | A | * | 5/1995 | Sugimoto et al. | .............. 716/4 |
| 5,473,619 | A | | 12/1995 | Sakaguchi | .................. 714/736 |
| 5,498,972 | A | * | 3/1996 | Haulin | ....................... 324/765 |
| 5,745,064 | A | * | 4/1998 | Ohya | .......................... 341/144 |
| 5,781,001 | A | * | 7/1998 | Takemoto | ................... 323/267 |
| 5,818,210 | A | * | 10/1998 | Ueno | .......................... 323/297 |
| 5,926,394 | A | * | 7/1999 | Nguyen et al. | ................. 716/1 |
| 5,994,916 | A | * | 11/1999 | Hayashi | ...................... 324/770 |
| 6,091,350 | A | * | 7/2000 | Paulos et al. | ............... 341/139 |
| 6,121,786 | A | * | 9/2000 | Yamagami et al. | ......... 324/765 |
| 6,137,667 | A | * | 10/2000 | Sieben et al. | .............. 361/91.1 |
| 6,154,041 | A | * | 11/2000 | Cheng | ......................... 324/758 |
| 6,255,839 | B1 | * | 7/2001 | Hashimoto | .................. 324/765 |
| 6,535,011 | B1 | * | 3/2003 | Sakaguchi | .................. 324/763 |

FOREIGN PATENT DOCUMENTS

| JP | 9312569 | 12/1997 |

* cited by examiner

*Primary Examiner*—Marc S. Hoff
*Assistant Examiner*—Mary Catherine Baran
(74) *Attorney, Agent, or Firm*—Birch, Stewart, Kolasch & Birch, LLP

(57) ABSTRACT

A testing device for LCD driver LSIs, includes: a voltage generator which generates a multiple number of expected voltages to be compared to each output voltage output from each of the output terminals and can selectively output multiple sets of reference voltages required for testing multiple kinds of semiconductor integrated circuits; a multiple number of differential amplifiers, each having two input terminals, one for receiving the output voltage output from each of the output terminals and the other for receiving the reference voltage from the reference voltage generator; and a comparator that receives the amplified output voltages from the multiple number of differential amplifiers and judges whether the amplified output voltage from each differential amplifier falls within the given voltage range.

11 Claims, 5 Drawing Sheets

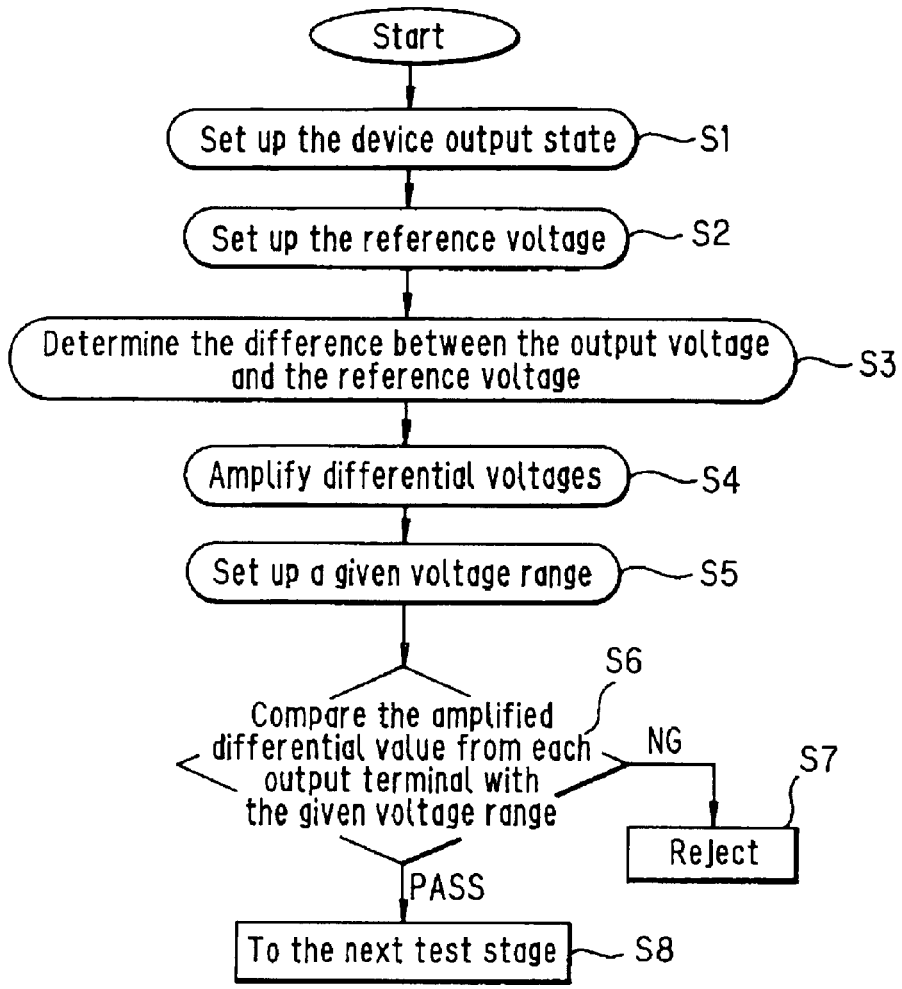

TESTING DEVICE AND TESTING METHOD FOR SEMICONDUCTOR INTEGRATED CIRCUITS

BACKGROUND OF THE INVENTION (1) Field of the Invention

The present invention relates to a testing device and testing method for a semiconductor integrated circuit (e.g., a LCD driver IC, etc.) that incorporates a multiple number of D/A converters and outputs voltages from the D/A converters via the associated output terminals, and particularly relates to a testing device and testing method which can examine the output voltages from the D/A converters, very quickly with high accuracy.

(2) Description of the Prior Art

With the development of LCD panels into a high precision configuration, LCD driver LSIs incorporated in LCD panels have become developed to deal with a greater number of outputs and a greater number of tones. For such tonal display, each output circuit in the LCD driver LSI incorporates its own D/A converter to output a tonal voltage. For example, a 6 bit D/A converter can display 64 levels of tones while a 8 bit D/A converter can display 256 levels of tones.

Upon the test for such a LCD driver LSI, it is checked if all the tonal voltage levels output from individual D/A converters fall within respective correct ranges and if the values of a tonal voltage level for all D/A converters meet the predetermined uniformity.

FIG. 1 is a conceptual view illustrating a conventional testing method by using a test example of an LCD driver LSI 51 incorporating 'm' output D/A converters 52 each having 'n' tonal levels.

A semiconductor testing device (tester) is used to supply an input signal to an LCD driver LSI 51 so that each D/A converter 52 outputs a voltage level corresponding to the first tonal level. The voltage levels corresponding to the first tonal level are output from associated output terminals (Y1, . . . , Ym) of LCD driver LSI 51 and input to input channels (1ch, . . . , mch) of tester 53. In tester 53, matrix switches 54 are sequentially turned on and off so that the outputs corresponding to the first tonal level are sequentially measured from the first output to the m-th output, one by one, using a high accuracy analog voltage measuring device 55 incorporated in the tester. The measured results are sequentially stored in an incorporated data memory 56. This process is repeated for 'n' tonal levels until all pieces of data relating to all the outputs (m outputs) for all tonal levels (n levels) can be stored into memory 56. As a result, m×n pieces of data will be stored into memory 56. The data stored in this memory 56 is subjected to a series of logical and arithmetical operations through an unillustrated processing unit incorporated in tester 53 so as to check each tonal voltage value of each output and the uniformity of each tonal voltage level between all the outputs.

In the testing of an LCD driver LSI 51, with the development towards a greater number of outputs and a greater number of tones, the amount of data to be picked up and the time required for data processing increase, so that the testing time increases sharply. Further, increasing the number of tonal levels requires a greater precision for measuring the voltage of each tonal level, needing longer testing time and also an expensive semiconductor testing device incorporating a high precision voltage measuring device.

As stated above, as LCD driver LSIs have become developed to deal with a greater number of outputs and a greater number of tones, the conventional testing method needs a much longer testing time and also needs an expensive semiconductor testing device incorporating a high precision voltage measuring device. Thus, the test cost is increasing more and more.

As a conventional semiconductor testing device to solve the above problems, Japanese Patent Application Laid-Open Hei 9 No.312569 has proposed a semiconductor testing device.

FIG. 2 is a block diagram showing the configuration of the semiconductor testing device disclosed in Japanese Patent Application Laid-Open Hei 9 No.312569.

The D/A converter testing device of this disclosure includes: a digital signal generator 60 for generating n-bit digital data; a clock generator 61; a D/A converter DUT 62 of a device under test which receives the data from digital signal generator 60 and a clock signal from clock generator 61 and outputs an analog signal Vg; a reference (REF) D/A converter 63 which receives the data branched from digital signal generator 60 and the clock signal branched from clock generator 61 and outputs a reference voltage Vref; a differential amplifier 64 receiving the output from D/A converter DUT 62 of the device under test at its one input and the output from reference D/A converter 63 at the other input to effect differential amplification; and a dual comparator 65 which receives the differential amplification output from differential amplifier 64 and checks if the signal in question falls in the allowable range between the upper and lower boundaries. With the above configuration, it is possible to provide a D/A converter testing device that provides a high throughput.

However, the semiconductor testing device (D/A converter testing device) disclosed in Japanese Patent Application Laid-Open Hei 9 No.312569 has suffered from the following difficulties. In the D/A converter testing device shown by Japanese Patent Application Laid-Open Hei 9 No.312569, since the same signals are input to both D/A converter DUT 62 of the device under test and reference D/A converter 63, it is necessary to use a non-defective D/A converter of the device under test for reference D/A converter 63. This is because the number of terminals is different depending upon the number of tones reproduced by the D/A converter of the device under test. Therefore, if a different type of D/A converter is to be tested, there is a need to have an extra non-defective D/A converter of the same type as the D/A converter as a reference D/A converter. The difficulties of the testing device depicted by Japanese Patent Application Laid-Open Hei 9 No.312569 are that there is a need to have a non-defective high-quality reference D/A converter for each type of D/A converter of the device to be tested or for each type of semiconductor integrated circuit incorporating a D/A converter to be tested.

SUMMARY OF THE INVENTION

The present invention has been made in view of the above prior art difficulties, and it is therefore an object of the present invention to provide a testing device and testing method for semiconductor integrated circuits which can markedly reduce the test time and enables a conventional inexpensive testing device to perform highly accurate testing without the necessity of providing a separate reference voltage generator for each type of semiconductor integrated circuit to be tested.

In order to achieve the above object, the present invention is configured as follows:

In accordance with the first aspect of the present invention, a testing device, for a semiconductor integrated circuit which incorporates a multiple number of D/A converters and outputs voltages from the D/A converters via associated output terminals, includes:

a reference voltage generator which generates a multiple number of reference voltages to be compared to each output voltage output from each of the output terminals and can selectively output multiple sets of reference voltages required for testing multiple kinds of semiconductor integrated circuits;

a multiple number of differential amplifiers, each having two input terminals, one for receiving the output voltage output from the associated output terminal and the other for receiving the reference voltage from the reference voltage generator; and a comparator that receives the amplified output voltages from the multiple number of differential amplifiers and judges whether the amplified output voltage from each of the differential amplifiers falls within a given voltage range.

In accordance with the second aspect of the present invention, the testing device for semiconductor integrated circuits having the above first feature is characterized in that the reference voltage generator is a D/A converter which receives a digital data signal different from that of the D/A converters incorporated in the semiconductor integrated circuit to generate the multiple number of reference voltages and can selectively output a necessary set of reference voltages from the multiple sets of reference voltages required for testing multiple kinds of semiconductor integrated circuits, in accordance with the selection of the digital data signal.

The third aspect of the present invention resides in a testing method for a semiconductor integrated circuit which incorporates a multiple number of D/A converters and outputs voltages from the D/A converters via associated output terminals, wherein a testing device for semiconductor integrated circuits is used which comprises:

a reference voltage generator which generates a multiple number of reference voltages to be compared to each output voltage output from each of the output terminals and can selectively output multiple sets of reference voltages required for testing multiple kinds of semiconductor integrated circuits;

a multiple number of differential amplifiers, each having two input terminals, one for receiving the output voltage output from the associated output terminal and the other for receiving the reference voltage from the reference voltage generator; and a comparator that receives the amplified output voltages from the multiple number of differential amplifiers and judges whether the amplified output voltage from each of the differential amplifiers falls within a given voltage range, wherein the reference voltage generator includes a D/A converter which receives a digital data signal different from the signals to the D/A converters incorporated in the semiconductor integrated circuit to generate the multiple number of reference voltages and can selectively output a necessary set of reference voltages from the multiple sets of reference voltages required for testing multiple kinds of semiconductor integrated circuits, in accordance with the selection of the digital data signal, the method comprising:

the first step for calculating the difference between the reference voltage generated from the reference voltage generator of the testing device and the output voltage output from each output terminal, for all the output terminals;

the second step for amplifying the values obtained from the first step; and the third step for judging at one time whether all the amplified differential values obtained in the second step in association with respective output terminals fall within the first given voltage range.

In accordance with the fourth aspect of the present invention, the testing method for semiconductor integrated circuits having the above third feature, comprises the above first through third steps and is characterized in that even if the output from the device under test varies, the first given voltage range can be kept at constant by computing the difference between the output from the device under test and the associated reference voltage generated from the above reference voltage.

In accordance with the fifth aspect of the present invention, the testing method for semiconductor integrated circuits having the above third feature, further comprises:

the fourth step for decreasing the width of the first given voltage range by a multiple of the predetermined voltage width to set up a second given voltage range; and the fifth step for judging at one time whether all the amplified differential values associated to respective output terminals fall within the second given voltage range, and is characterized in that the fourth and fifth steps are repeated until the judgment at the fifth step changes.

In accordance with the sixth aspect of the present invention, the testing method for semiconductor integrated circuits having the above fifth feature is characterized in that, based on the value of the second given voltage range when the judgment at the fifth step changes, the devices under test are classified into a plurality of ranks.

In accordance with the seventh aspect of the present invention, the testing method for semiconductor integrated circuits having the above fifth feature is characterized in that the width of the second given range is made narrower as the above fourth and fifth steps are repeated.

The eighth aspect of the present invention resides in a storage medium for storing the program for a computer to execute a testing method for a semiconductor integrated circuits which incorporates a multiple number of D/A converters and outputs voltages from the D/A converters via associated output terminals, wherein a testing device for semiconductor integrated circuits is used which comprises:

a reference voltage generator which generates a multiple number of reference voltages to be compared to each output voltage output from each of the output terminals and can selectively output multiple sets of reference voltages required for testing multiple kinds of semiconductor integrated circuits;

a multiple number of differential amplifiers, each having two input terminals, one for receiving the output voltage output from the associated output terminal and the other for receiving the reference voltage from the reference voltage generator; and a comparator that receives the amplified output voltages from the multiple number of differential amplifiers and judges whether the amplified output voltage from each of the differential amplifiers falls within a given voltage range, wherein the reference voltage generator includes a D/A converter which receives a digital data signal different from the signals to the D/A converters incorporated in the semiconductor integrated circuit to generate the multiple number of reference voltages and can selectively output a necessary set of reference voltages from the multiple sets of reference voltages required for testing multiple kinds of semiconductor integrated circuit, in accordance with the selection of the digital data signal, the method comprising:

the first step for calculating the difference between the reference voltage generated from the reference voltage generator of the testing device and the output voltage output from each output terminal, for all the output terminals;

the second step for amplifying the values obtained from the first step; and the third step for judging at one time whether all the amplified differential values obtained in the second step in association with respective output terminals fall within the first given voltage range, wherein even if the output from the device under test varies, the first given voltage range can be kept at constant by computing the difference between the output from the device under test and the associated reference voltage generated from the above reference voltage.

The ninth aspect of the present invention resides in a storage medium for storing the program for a computer to execute a testing method for a semiconductor integrated circuits which incorporates a multiple number of D/A converters and outputs voltages from the DIA converters via associated output terminals, wherein a testing device for semiconductor integrated circuits is used which comprises:

a reference voltage generator which generates a multiple number of reference voltages to be compared to each output voltage output from each of the output terminals and can selectively output multiple sets of reference voltages required for testing multiple kinds of semiconductor integrated circuits;

a multiple number of differential amplifiers, each having two input terminals, one for receiving the output voltage output from the associated output terminal and the other for receiving the reference voltage from the reference voltage generator; and a comparator that receives the amplified output voltages from the multiple number of differential amplifiers and judges whether the amplified output voltage from each of the differential amplifiers falls within a given voltage range, wherein the reference voltage generator includes a D/A converter which receives a digital data signal different from the signals to the D/A converters incorporated in the semiconductor integrated circuit to generate the multiple number of reference voltages and can selectively output a necessary set of reference voltages from the multiple sets of reference voltages required for testing multiple kinds of semiconductor integrated circuit, in accordance with the selection of the digital data signal, the method comprising:

the first step for calculating the difference between the reference voltage generated from the reference voltage generator of the testing .device and the output voltage output from each output terminal, for all the output terminals;

the second step for amplifying the values obtained from the first step;

the third step for judging at one time whether all the amplified differential values obtained in the second step in association with respective output terminals fall within the first given voltage range, wherein even if the output from the device under test varies, the first given voltage range can be kept at constant by computing the difference between the output from the device under test and the associated reference voltage generated from the above reference voltage;

the fourth step for decreasing the width of the first given voltage range by a multiple of the predetermined voltage width to set up a second given voltage range; and the fifth step for judging at one time whether all the amplified differential values associated to respective output terminals falls within the second given voltage range, wherein the fourth and fifth steps are repeated until the judgment at the fifth step changes.

In accordance with the tenth aspect of the present invention, the storage medium for storing the program for a computer to execute the testing method for semiconductor integrated circuits having the above ninth feature is characterized in that, based on the value of the second given voltage range when the judgment at the fifth step changes, the devices under test are classified into a plurality of ranks.

In accordance with the eleventh aspect of the present invention, the storage medium for storing the program for a computer to execute the testing method for semiconductor integrated circuits having the above ninth feature is characterized in that the width of the second given range is made narrower as the above fourth and fifth steps are repeated.

According to the testing device and testing method for semiconductor integrated circuits of the present invention, the output voltage output from the output terminal of each D/A converter in a semiconductor integrated circuit is compared to the reference voltage in each differential amplifier. The results, i.e., the amplified output voltages from the individual differential amplifiers are input in parallel to a comparator. In the comparator, it is judged as to whether the amplified output voltage from each of the differential amplifiers falls within the given voltage range.

According to the testing device and testing method for semiconductor integrated circuits of the present invention, it is possible to markedly reduce the test time by using a comparator which effects simultaneous judgements of all the amplified output voltages, in testing a semiconductor integrated circuit such as a LCD driver LSI which has been developed to deal with a greater number of outputs and a greater number of tones. Further, the testing device of the present invention enables high accuracy testing using a conventional inexpensive tester without the necessity of a high accuracy analog voltage measuring device for voltage measurement as in the conventional configuration, thus making it possible to sharply reduce the testing cost. It is possible to classify the quality of each device based on the variation in voltage output, so that applications of the LCD panel to which the device is applied can be enlarged, thus making it possible to improve the production yield and reducing LCD drivers to fair price. Further, since the reference voltage generator is commonly used for testing multiple kinds of semiconductor integrated circuits, it is no longer necessary to provide a separate reference voltage generator for each type of semiconductor integrated circuit under test. Consequently, the present invention enables only a single testing device to achieve efficient testing of multiple kinds of semiconductor integrated circuits.

The width of the first given voltage range is made narrower by a multiple of the predetermined voltage width to set up a second given voltage range, and it is judged at the same time whether all the differential amplified values from all the associated output terminals fall within the second given voltage range. The devices under test are classified into multiple ranks, based on the second given voltage range which is determined by checking the change in the pass/reject judgement result. Therefore, it is possible to classify the quality of each device based on the variation in voltage output, so that usage of the LCD panel to which the device is applied can be enlarged, thus making it possible to improve the production yield and reducing LCD drivers to fair price.

BRIEF DESCRIPTION OF THE DRAWINGS

FIG. 6 is a flowchart showing the operation of the same embodiment;

FIG. 7 is an illustrative view showing the scheme for narrowing down the first given voltage range in accordance with a second embodiment of the present invention.

DESCRIPTION OF THE PREFERRED EMBODIMENTS

The present invention will hereinafter be described in detail with reference to the embodiments of the invention.

Figure 1:
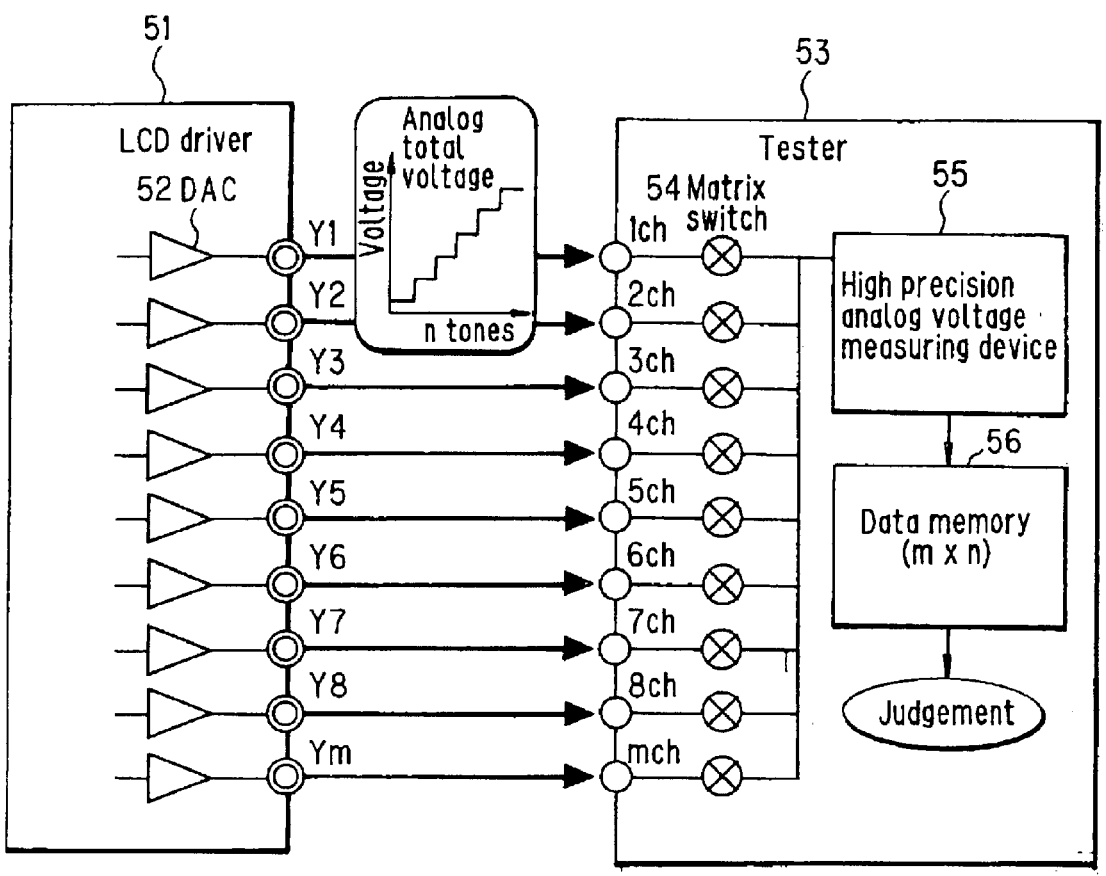
FIG. 1 is a block diagram showing the configuration of a conventional testing device.
Figure 2:
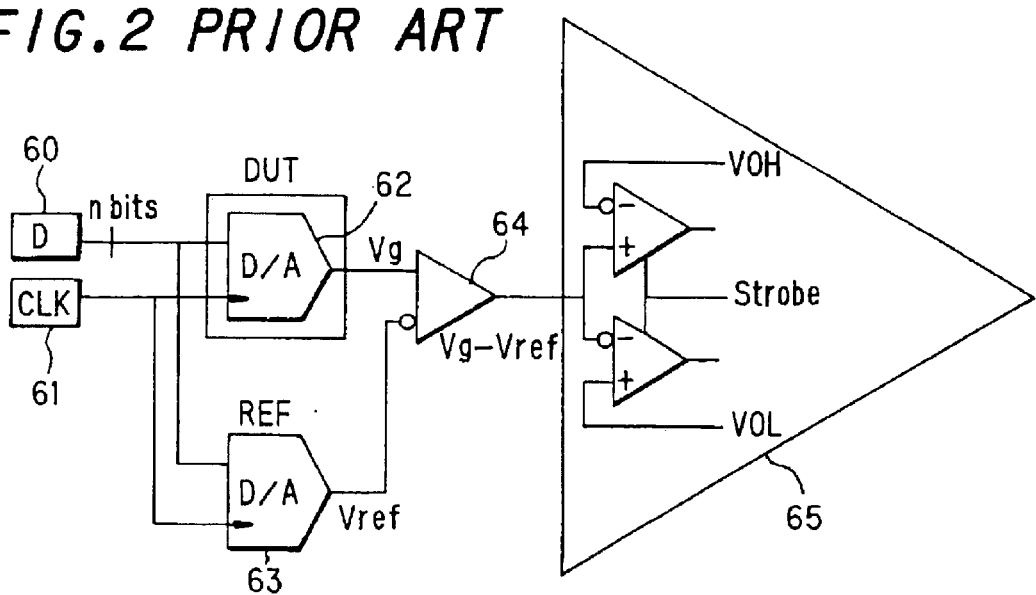
FIG. 2 is a block diagram showing the configuration of another conventional testing device.
Figure 3:
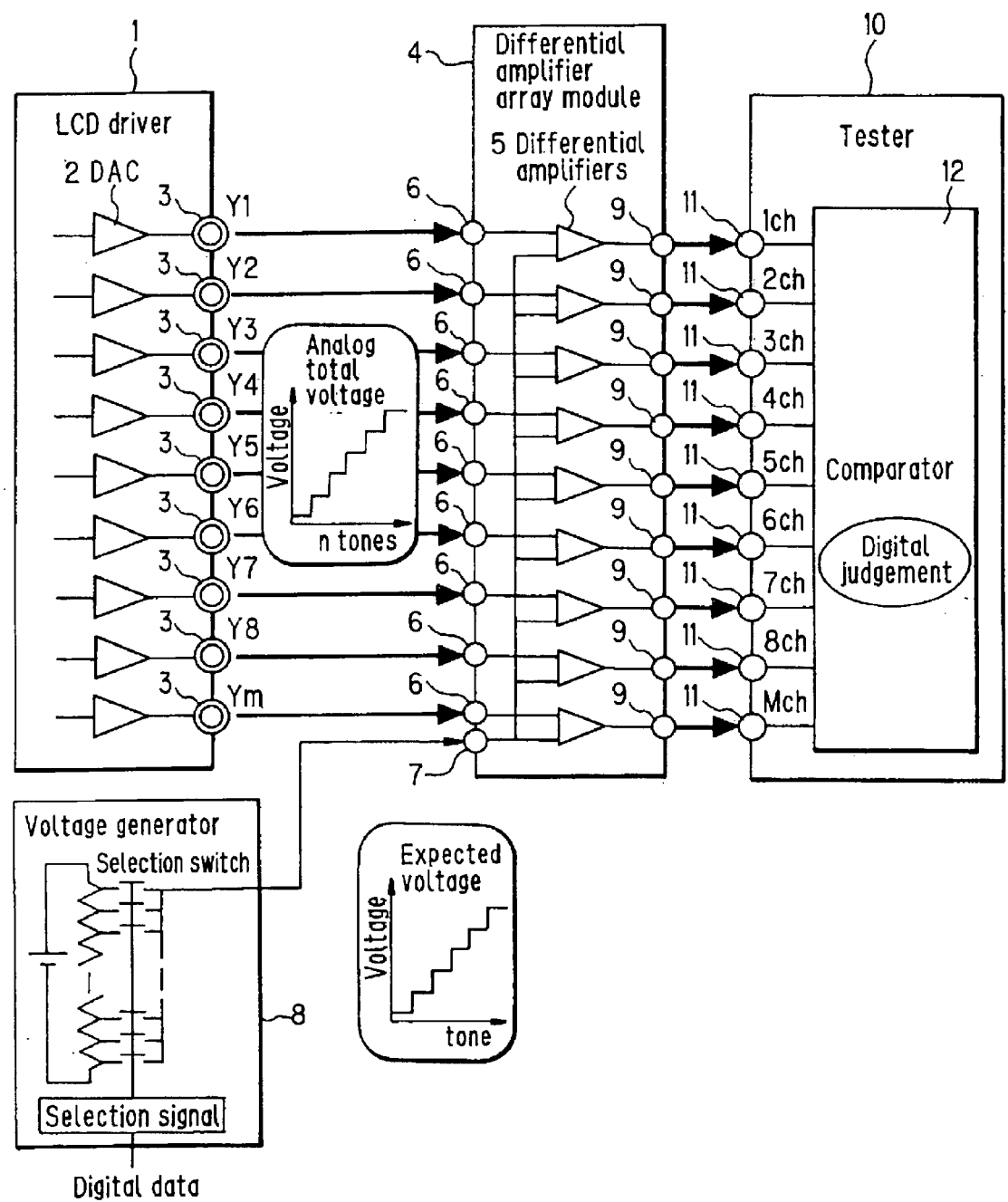
FIG. 3 is a block diagram showing a configuration of a LCD driver LSI testing device in accordance with one embodiment of the present invention.
Figure 4:
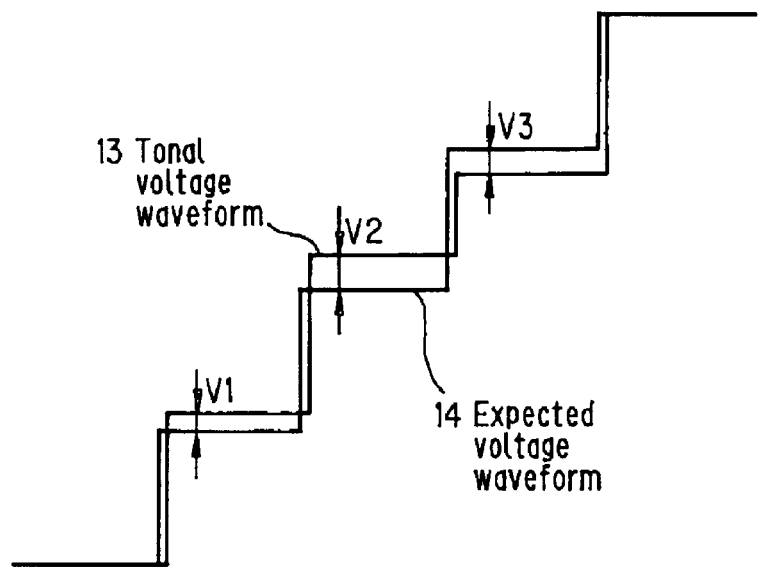
FIG. 4 is a voltage waveform chart for illustrating the operation of the same embodiment.

FIG. 3 is a block diagram showing a configuration of an LCD driver LSI testing device in accordance with one embodiment of the present invention. FIG. 3 shows a case where m-output, n-tonal LCD driver LSI is tested. FIG. 4 is a voltage waveform chart for illustrating the operation of the testing device shown in FIG. 3.

An LCD driver LSI 1 has m output terminals 3. Each output terminal 3 is connected to the output terminal of an associated D/A converter 2. Each D/A converter 2 outputs a tonal voltage for n-levels of tones. The tonal voltage outputs from all output terminals 3 are supplied in parallel to a differential amplifier module array 4 made up of a number of differential amplifiers 5. More specifically, each of the tonal voltage outputs is input to one of the two inputs to an associated differential amplifier 5.

A voltage generator 8 is for sequentially generating n-levels of reference voltages (expected voltages) to be compared to the aforementioned tonal voltages. The expected voltage output from voltage generator 8 is output to a common input terminal 7 which is input to the other terminals of all differential amplifiers 5 constituting differential amplifier array module 4. This reference voltage generator 8 is configured to be commonly used for testing of different kinds of LCD driver LSIs, each having different D/A converter's tonal output level sets from others. More specifically, the reference voltage generator is able to generate a multiple number of tonal voltages, in increments of Vmin, a predetermined, smallest voltage step, in accordance with the input digital data, and is able to sequentially generate the desired tonal voltages when multiple pieces of digital data corresponding to the standard multiple tonal voltages to be output from an LCD driver LSI 1 under test are selected and sequentially supplied to the reference voltage generator. That is, selection of the digital data supplied to this reference voltage generator 8 enables free generation of a different set of reference voltages required for LCD driver LSIs 1 of a desired type. Alternatively, the reference voltage generator may also be configured in the following manner. If all the sets of the tonal voltages to be output from D/A converters incorporated in different types of semiconductor integrated circuits to be tested by the testing device having the reference voltage generator are known, it is possible to configure the reference voltage generator so as to be able to output all the tonal voltages in accordance with the input digital data signal (in this case, the voltage difference between adjacent output reference voltages is not always constant, differing from the above configuration). Thereby, it is possible to configure a reference voltage generator which can selectively generate multiple sets of reference voltages, required for testing of the multiple kinds of semiconductor integrated circuits.

As shown in FIG. 4, each differential amplifier 5 produces an amplified output voltage which is obtained by amplifying the voltage deviation of a tonal voltage 13 output from LCD driver LSI 1 from an expected voltage 14 output from voltage generator 8 (e.g., V1, V2 and V3, shown in FIG. 4) by a given ratio (e.g., 100 times or greater). This amplifying process of the voltage deviation by means of differential amplifiers 5 assures high precision in the comparing judgement in a subsequent comparator 12. The above amplified output voltages are output from differential amplifiers 5 via output terminals 9, which are connected to associated input channels 11 of a tester 10, so that each amplified output voltage is input to tester 10. A comparator 12 as a part of tester 10 checks all the amplified output voltages, at the same time, judging whether the amplified output voltage supplied from each differential amplifier via associated input channel 11 falls within the given range (for example, whether the voltage deviation falls within the range of ±20 mV, for 64 tones, and within the range of ±5 mV, for 256 tones), and outputs a judgement signal which indicates that all the input voltages fall within the associated voltage ranges or that any of the input voltages falls outside the predetermined range.

Figure 5:
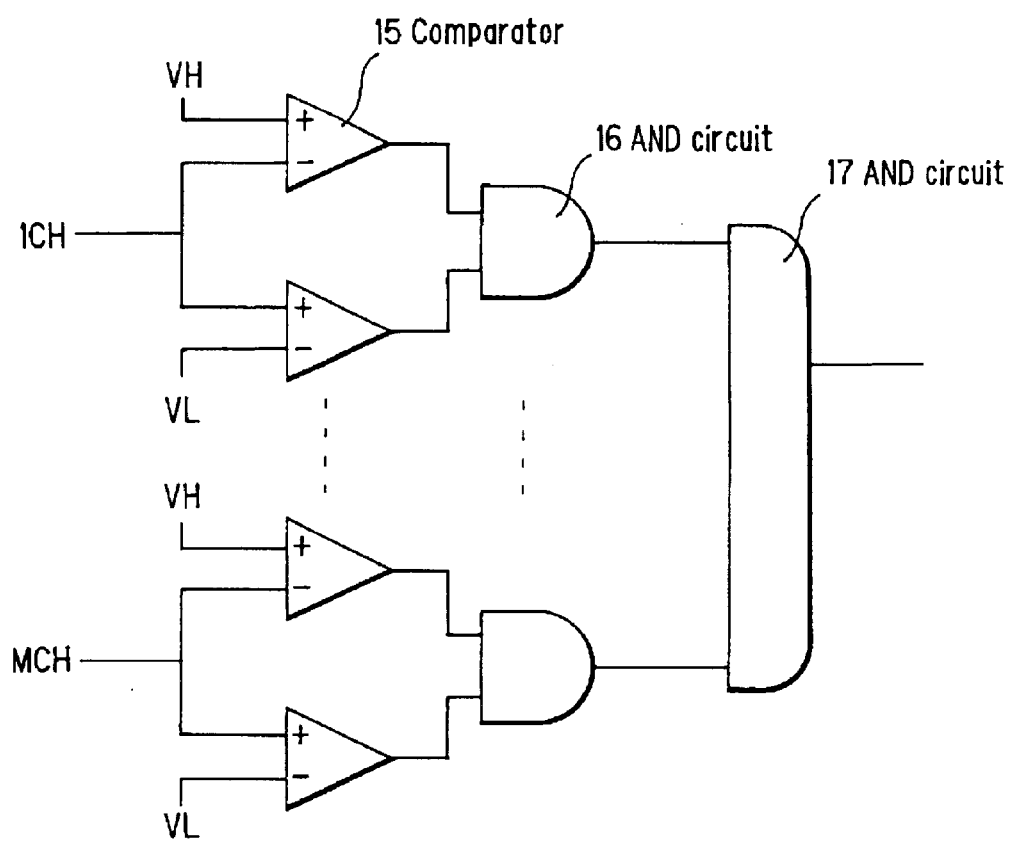
FIG. 5 is a block diagram showing the configuration of the converter shown in FIG. 3.

FIG. 5 shows a block diagram of this comparator 12. In this figure, comparator 12 includes a voltage comparator 15 and AND circuits 16 and 17. VH is the upper limit voltage of the given voltage range and VL is the lower limit voltage of the given voltage range. In this configuration, if all the amplified output voltages supplied from differential amplifiers 5 fall within the given voltage range, AND circuit 17 produces the H-level output. If one of the amplified output voltages falls out of the given voltage range, AND circuit 17 produces the L-level output.

The testing device of the present embodiment can be realized by adding only a differential amplifier array module 4 and a voltage generator 8 to a conventional tester 10 of a built-in comparator type. In other words, a combination of only some small devices with the existing device enables provision of a markedly useful testing device which can perform highly accurate testing in a short period.

The operation of the testing device of the present embodiment will be described hereinbelow. FIG. 6 is a flowchart showing the operation of this embodiment.

To begin with, LCD driver LSI 1 is set and operated so that the tonal voltage representing the first tone is output from 'm' output terminals 3 (S1). The tonal voltages output from 'm' output terminals 3 are input in parallel to associated differential amplifiers 5 through their input terminals 6, one of the two being input to each differential amplifier. Voltage generator 8 is controlled by being supplied with the predetermined digital data signal so as to generate an expected voltage corresponding to the first tonal voltage in LCD driver LSI 1 under test (S2). This expected voltage is input to the other input terminal (common input terminal) 7 of each differential amplifier 5.

At S3, each differential amplifier 4, based on the associated input voltage, calculates the difference between the first tonal voltage output from the associated terminal of LCD driver LSI 1 and the expected voltage (S3) and amplifies the calculation by a given magnification (e.g., 100 times or greater) so as to produce a voltage-amplified output voltage (S4). The voltage-amplified output voltages from all amplifiers 4 are input in parallel to tester 10, in which a given voltage range has been set up (S5). In comparator 12 of tester 10, it is judged whether each voltage-amplified output voltage falls within the given voltage range (S6). In this judgment, when AND circuit 17 produces the L-level output, which means that any of the output voltages is judged to have fallen out of the given range, the testing operation is stopped at that point so that the LSI under test is rejected as defective (S7). On the contrary, when AND circuit 17 produces the H-level output, which means that all the output voltages are judged to have fallen within the given voltage range, the operation goes to the next step, i.e., the test on the second tonal voltage level (S8).

Specifically, LCD driver LSI 1 is operated so as to output the tonal voltage representing the second tone from 'm' output terminals 3 (S1). The tonal voltages output from 'm' output terminals 3 are input in parallel to associated differential amplifiers 5 through their input terminals 6, one of the two input to each differential amplifier. Voltage generator 8 is set and controlled, as it is supplied with the predetermined digital data signal, so as to generate an expected voltage 14 corresponding to the second tonal voltage 13 in LCD driver LSI 1 under test (S2). This expected voltage is input to the other input terminal (common input terminal) 7 of each differential amplifier 5. Each differential amplifier 5, based on the associated input voltage, calculates the difference between the second tonal voltage output from the associated terminal of LCD driver LSI 1 and the expected voltage (S3 (the first step)) and amplifies the calculation by a given magnification (e.g., 100 times or greater)) so as to produce a voltage-amplified output voltage (S4 (the second step)). The voltage-amplified output voltages from all amplifiers 4 are input in parallel to tester 10, in which a given voltage range has been set up (S5). In comparator 12 of tester 10, it is judged whether each voltage-amplified output voltage falls within the given voltage range (S6 (the third step)). In this judgment, when AND circuit 17 produces the L-level output, which means that any of the output voltages is judged to have fallen out of the given range, the testing operation is stopped at that point so that the LSI under test is rejected as defective (S7). On the contrary, when AND circuit 17 produces the H-level output, which means that all the output voltages are judged to have fallen within the given voltage range, the operation goes to the next step, i.e., the test on the third tonal voltage level (S8).

The same test will be repeated until the test on the n-th tonal voltage is completed. Thus, it is possible to check all the tonal voltages output from individual D/A converters incorporated in the LCD driver LSI.

Next, another embodiment according to the present invention will be described.

Tonal voltage waveform 13 output from LCD driver 1 having a plurality of D/A converters presents voltage deviations V1, V2 and V3 with respect to the expected voltage waveform 14, as shown in FIG. 4. These deviations are attributed to the voltage deviation at the output voltage from individual D/A converters 2 in LCD driver 1. Detection of the amount of voltage deviation also takes an important role in the LCD driver test.

In the conventional scheme, all the levels of the tonal voltages are first determined by the high-precision analog measuring device and these values are subjected to the predetermined arithmetic operation in the tester so as to determine the variations in voltage. However, according to the former embodiment, the differential voltages output from differential amplifiers 5 are input to comparator 15 where each input is always compared with constant voltages VH and VL set therein. In contrast, in the present embodiment, the levels of VH and VL are varied individually, so that the voltage difference between the level on the VH side at which the device under test will translate from pass to reject and the level on the VL side at which the device under test will translate from pass to reject can thereby be determined.

Now a specific embodiment will be described referring to actual numerals.

In the example of the numeric measurement shown in FIG. 7, it is checked whether all the outputs corresponding to an ideal value fall within the range between VOH=2V and VOL=1V. The present embodiment provides a further detailed evaluation of the devices (VOH=2 V, VOL=1 V: the first given voltage range).

First, VOH is varied from 2 V in decrements of 0.1 V so as to detect the point at which the device under test becomes rejected. The maximum value or the farthest value from the ideal value among all the pins is considered the 'reject' point. For example, pin 2 shown in FIG. 7 has a maximum value, VOH=1.86V which is determined as the 'reject' point.

In a similar manner, VOL is varied from 1 V in increments of 0.1 V so as to detect the point at which the device under test becomes rejected.

In this case, the minimum value or the farthest value from the ideal value among all the pins is considered the 'reject' point. For example, pin 1 shown in FIG. 7 has a minimum value, VOH=1.24V, which is determined as the 'reject' point (VOH=1.86V, VOL=1.24 V: the second given voltage range). The range from VOL=1.24 V to VOH=1.86 V detected here represents the variation of all the pins and the devices can be ranked or their usage can be classified according to this value. In the above description, the reference values are varied by steps of 0.1 V, but this varying unit can be made smaller so as to enhance the measuring accuracy. Here, VOH and VOL are set in tester 10.

Figure 8:
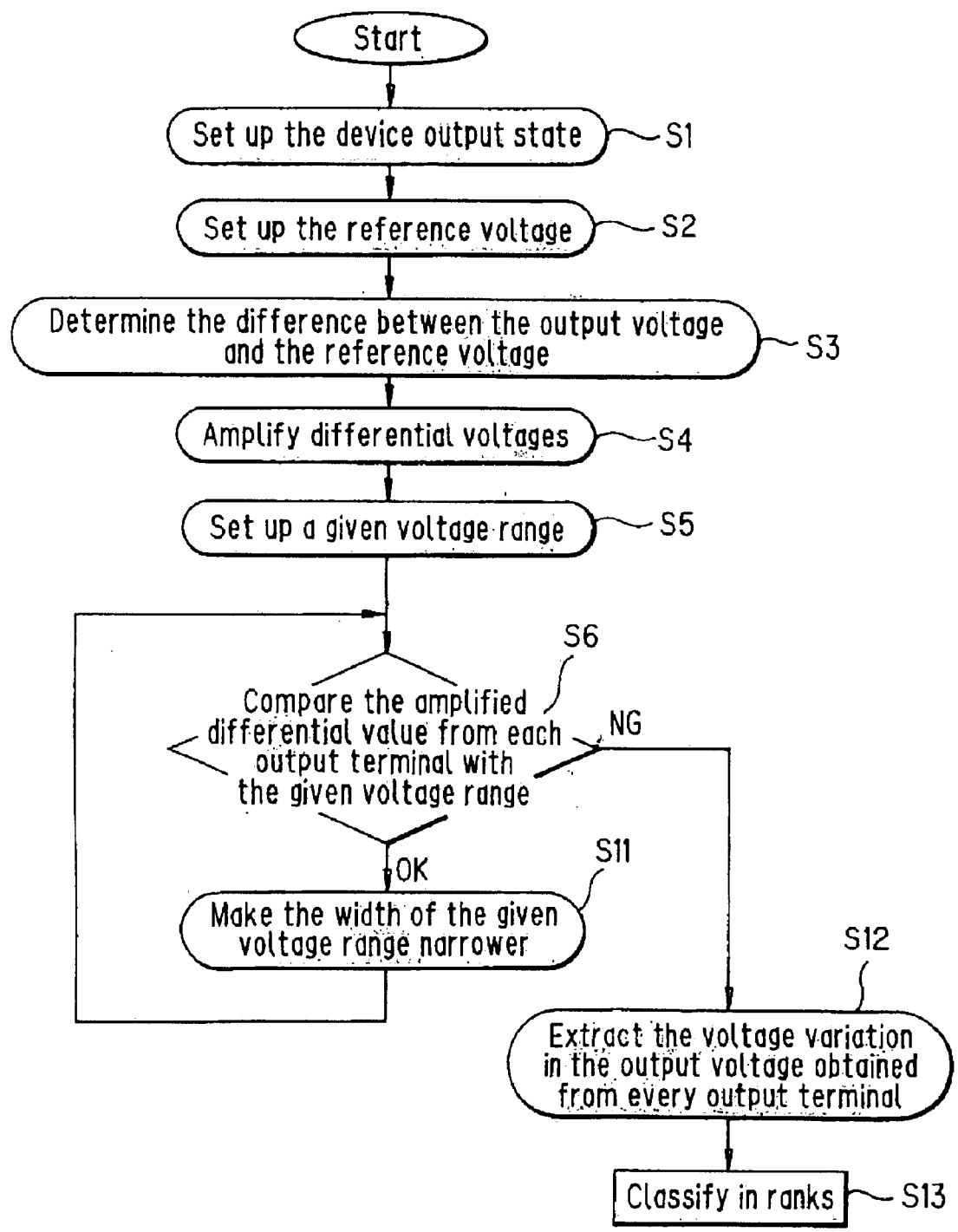
FIG. 8 is a flowchart showing the operation of the second embodiment.

FIG. 8 is a flowchart showing the operation of the present embodiment. This flowchart shows the operation for a single tone, and the same reference numerals are allotted to those corresponding to FIG. 6.

This flowchart differs from that of FIG. 6, in the steps of S11, S12 and S13. That is, at S6 (the third step), when comparator 12 of tester 10 judges whether each voltage-amplified output voltage falls within the given voltage range and AND circuit 17 produces the H-level output, which means that all the output voltages are judged to fall within the given voltage range, the given voltage range is made narrower to set up a second given range (S11, the fourth step). Then, the operation returns again to S6 (the fifth step), where it is checked as to whether the voltage-applied output voltage falls within the second given voltage range.

Upon the judgement at S6 (the fifth step), when AND circuit 17 produces the L-level output, which means that any of the output voltages is judged to fall out of the predetermined range, the voltage variation of the output voltages from the output terminals is extracted, and based on the obtained voltage variation, the device is ranked (S13).

As S6 and S11 are repeated, the width of the given voltage range is made narrower. In this way, it is possible to rank a semiconductor integrated circuit under test by specifying where in the voltage range the device belongs to.

In the present invention, it is very effective if use is made of a storage medium that stores the program for allowing the computer to perform the above first through fifth testing steps.

As has been detailed heretofore, according to the testing device for semiconductor integrated circuits of the present invention, it is possible to markedly reduce the test time by using a comparator which effects simultaneous judgements of all the amplified output voltages, in testing a semiconductor integrated circuit such as an LCD driver LSI which has been developed to deal with a greater number of outputs and a greater number of tones. Further, the testing device of the present invention enables high accuracy testing using a conventional inexpensive tester without the necessity of a high accuracy analog voltage measuring device for voltage measurement as in the conventional configuration, thus making it possible to sharply reduce the testing cost. It is possible to classify the quality of each device based on the variation in voltage output, so that applications of the LCD panel to which the device is applied can be enlarged, thus making it possible to improve the production yield and reducing LCD drivers to fair price. Further, since the reference voltage generator is commonly used for testing multiple kinds of semiconductor integrated circuits, it is no longer necessary to provide a separate reference voltage generator for each type of semiconductor integrated circuit under test. Consequently, the present invention enables only a single testing device to achieve efficient testing of multiple kinds of semiconductor integrated circuits.

What is claimed is:

1. A testing device for a semiconductor integrated circuit which semiconductor integrated circuit incorporates a multiple number of D/A converters and outputs voltages from the D/A converters via associated output terminals, comprising:

a reference voltage generator which sequentially generates a multiple number of reference voltages, one reference voltage at a time, to be compared to each output voltage output from each of the output terminals and can selectively output multiple sets of reference voltages required for testing multiple kinds of semiconductor integrated circuits;

a multiple number of differential amplifiers, each having two input terminals, one for sequentially receiving the output voltage output from the associated output terminal and the other for sequentially receiving the reference voltage from the reference voltage generator; and a comparator that receives the amplified output voltages from the multiple number of differential amplifiers and judges whether the amplified output voltage from each of the differential amplifiers falls within a given voltage range.

2. The testing device for semiconductor integrated circuits according to claim 1, wherein the reference voltage generator is a D/A converter which receives a digital data signal different from that of the D/A converters incorporated in the semiconductor integrated circuit to generate the multiple number of reference voltages and can selectively output a necessary set of reference voltages from the multiple sets of reference voltages required for testing multiple kinds of semiconductor integrated circuits, in accordance with the selection of the digital data signal.

3. A testing method for a semiconductor integrated circuit, the semiconductor integrated circuit incorporates a multiple number of D/A converters and outputs voltages from the D/A converters via associated output terminals, wherein a testing device for semiconductor integrated circuits is used which comprises:

a reference voltage generator which sequentially generates a multiple number of reference voltages, one reference voltage at a time, to be compared to each output voltage output from each of the output terminals and can selectively output multiple sets of reference voltages required for testing multiple kinds of semiconductor integrated circuits;

a multiple number of differential amplifiers, each having two input terminals, one for sequentially receiving the output voltage output from the associated output terminal and the other for sequentially receiving the reference voltage from the reference voltage generator; and a comparator that receives the amplified output voltages from the multiple number of differential amplifiers and judges whether the amplified output voltage from each of the differential amplifiers falls within a given voltage range, wherein the reference voltage generator includes a D/A converter which receives a digital data signal different from the signals to the D/A converters incorporated in the semiconductor integrated circuit to generate the multiple number of reference voltages and can selectively output a necessary set of reference voltages from the multiple sets of reference voltages required for testing multiple kinds of semiconductor integrated circuits, in accordance with the selection of the digital data signal, the method comprising:

the first step for calculating the difference between the reference voltage generated from the reference voltage generator of the testing device and the output voltage output from each output terminal, for all the output terminals;

the second step for amplifying the values obtained from the first step; and the third step for judging at one time whether all the amplified differential values obtained in the second step in association with respective output terminals fall within the first given voltage range.

4. The testing method for semiconductor integrated circuits according to claim 3 comprising the above first through third steps, wherein even if the output from the device under test varies, the first given voltage range can be kept at constant by computing the difference between the output from the device under test and the associated reference voltage generated from the above reference voltage.

5. The testing method for semiconductor integrated circuits according to claim 3, further comprising:

the fourth step for decreasing the width of the first given voltage range by a multiple of the predetermined voltage width to set up a second given voltage range; and the fifth step for judging at one time whether all the amplified differential values associated to respective output terminals fall within the second given voltage range, wherein the fourth and fifth steps are repeated until the judgment at the fifth step changes.

6. The testing method for semiconductor integrated circuits according to claim 5, wherein, based on the value of the second given voltage range when the judgment at the fifth step changes, the devices under test are classified into a plurality of ranks.

7. The testing method for semiconductor integrated circuits according to claim 5, wherein the width of the second given range is made narrower as the above fourth and fifth steps are repeated.

8. A storage medium for storing the program for a computer to execute a testing method for semiconductor integrated circuits, each semiconductor integrated circuit incorporates a multiple number of D/A converters and outputs voltages from the D/A converters via associated output terminals, wherein a testing device for semiconductor integrated circuits is used which comprises:

a reference voltage generator which sequentially generates a multiple number of reference voltages, one reference voltage at a time, to be compared to each output voltage output from each of the output terminals and can selectively output multiple sets of reference voltages required for testing multiple kinds of semiconductor integrated circuits;

a multiple number of differential amplifiers, each having two input terminals, one for sequentially receiving the output voltage output from the associated output terminal and the other for sequentially receiving the reference voltage, from the reference voltage generator; and a comparator that receives the amplified output voltages from the multiple number of differential amplifiers and judges whether the amplified output voltage from each of the differential amplifiers falls within a given voltage range, wherein the reference voltage generator includes a D/A converter which receives a digital data signal different from the signals to the D/A converters incorporated in the semiconductor integrated circuit to generate the multiple number of reference voltages and can selectively output a necessary set of reference voltages from the multiple sets of reference voltages required for testing multiple kinds of semiconductor integrated circuit, in accordance with the selection of the digital data signal, the program comprising:

the first step for calculating the difference between the reference voltage sequentially generated from the reference voltage generator of the testing device and the output voltage sequentially output from each output terminal, for all the output terminals;

the second step for amplifying the values obtained from the first step; and the third step for judging at one time whether all the amplified differential values obtained in the second step in association with respective output terminals fall within the first given voltage range, wherein even if the output from the device under test varies, the first given voltage range can be kept at constant by computing the difference between the output from the device under test and the associated reference voltage generated from the above reference voltage.

9. A storage medium for storing the program for a computer to execute a testing method for a semiconductor integrated circuits which incorporates a multiple number of D/A converters and outputs voltages from the D/A converters via associated output terminals, wherein a testing device for semiconductor integrated circuits is used which comprises:

a reference voltage generator which generates a multiple number of reference voltages to be compared to each output voltage output from each of the output terminals and can selectively output multiple sets of reference voltages required for testing multiple kinds of semiconductor integrated circuits:

a multiple number of differential amplifiers, each having two input terminals, one for receiving the output voltage output from the associated output terminal and the other for receiving the reference voltage from the reference voltage generator; and a comparator that receives the amplified output voltages from the multiple number of differential amplifiers and judges whether the amplified output voltage from each of the differential amplifiers falls within a given voltage range, wherein the reference voltage generator includes a D/A converter which receives a digital data signal different from the signals to the D/A converters incorporated in the semiconductor integrated circuit to generate the multiple number of reference voltages and can selectively output a necessary set of reference voltages from the multiple sets of reference voltages required for testing multiple kinds of semiconductor integrated circuit, in accordance with the selection of the digital data signal, the program comprising:

the first step for calculating the difference between the reference voltage generated from the reference voltage generator of the testing device and the output voltage output from each output terminal, for all the output terminals; the second step for amplifying the values obtained from the first step;

the third step for judging at one time whether all the amplified differential values obtained in the second step in association with respective output terminals fall within the first given voltage range, wherein even if the output from the device under test varies, the first given voltage range can be kept at constant by computing the difference between the output from the device under test and the associated reference voltage generated from the above reference voltage;

the fourth step for decreasing the width of the first given voltage range by a multiple of the predetermined voltage width to set up a second given voltage range; and the fifth step for judging at one time whether all the amplified differential values associated to respective output terminals falls within the second given voltage range, wherein the fourth and fifth steps are repeated until the judgment at the fifth step changes.

10. The storage medium for storing the program for a computer to execute the testing method for semiconductor integrated circuits according to claim 9, wherein, based on the value of the second given voltage range when the judgment at the fifth step changes, the devices under test are classified into a plurality of ranks.

11. The storage medium for storing the program for a computer to execute the testing method for semiconductor integrated circuits according to claim 9, wherein the width of the second given range is made narrower as the above fourth and fifth steps are repeated.

* * * * *